United States Patent [19]
Miller et al.

[11] Patent Number: 5,615,270
[45] Date of Patent: *Mar. 25, 1997

[54] METHOD AND APPARATUS FOR DYNAMIC SOUND OPTIMIZATION

[75] Inventors: Thomas E. Miller, Arlington Heights, Ill.; Kenneth L. Kantor, Oakland, Calif.; Jeffrey Barish; Duane K. Wise, both of Boulder, Colo.

[73] Assignee: International Jensen Incorporated, Schiller Park, Ill.

[ * ] Notice: The portion of the term of this patent subsequent to Apr. 8, 2013, has been disclaimed.

[21] Appl. No.: 466,411

[22] Filed: Jun. 6, 1995

Related U.S. Application Data

[63] Continuation of Ser. No. 44,643, Apr. 8, 1993, Pat. No. 5,434,922.

[51] Int. Cl.⁶ .................................................. H03G 3/24
[52] U.S. Cl. ................................................ 381/57; 381/108
[58] Field of Search .................................... 381/57, 94, 98, 381/71, 103, 107, 108

[56] References Cited

U.S. PATENT DOCUMENTS

| | | | |
|---|---|---|---|
| 4,553,257 | 11/1985 | Mori et al. | 381/57 |
| 4,672,674 | 6/1987 | Clough et al. | 381/71 |
| 4,837,834 | 6/1989 | Allie | 381/71 |
| 4,868,881 | 9/1989 | Zwicker et al. | 381/107 |
| 4,965,834 | 10/1990 | Miller | 381/94 |
| 5,018,202 | 5/1991 | Takahashi et al. | 381/71 |
| 5,434,922 | 7/1995 | Miller et al. | 381/57 |

*Primary Examiner*—Forester W. Isen
*Attorney, Agent, or Firm*—McAndrews, Held & Malloy, Ltd.

[57] ABSTRACT

This invention comprises a system to compensate for the noise level inside a vehicle by measuring the music level and the noise level in the vehicle through the use of analog to digital conversion and adaptive digital filtering, including a sensing microphone in the vehicle cabin to measure both music and noise; preamplification and analog to digital (A/D) conversion of the microphone signal; A/D conversion of a stereo music signal; a pair of filters that use an adaptive algorithm such as the known Least Mean Squares ("LMS") method to extract the noise from the total cabin sound; an estimation of the masking effect of the noise on the music; an adaptive correction of the music loudness and, optionally, equalization to overcome the masking effect; digital to analog (D/A) conversion of the corrected music signal; and transmission of the corrected music signal to the audio system.

29 Claims, 20 Drawing Sheets

METHOD AND APPARATUS FOR DYNAMIC SOUND OPTIMIZATION

CROSS-REFERENCE TO RELATED APPLICATIONS

This application is a continuation of U.S. Ser. No. 08/044,643, filed Apr. 8, 1993, now U.S. Pat. No. 5,434,922. U.S. Ser. No. 08/044,643 is hereby incorporated by reference herein in its entirety to provide continuity of disclosure.

BACKGROUND OF THE INVENTION

This invention relates to a method for improving the sound reproduced by audio systems in vehicles and, in particular, to a system which compensates for noise outside the audio system. When music or speech is reproduced in a vehicle, the signal is corrupted by external acoustic noise present in the vehicle. This noise my result from and is dependent upon vehicle speed, road condition, weather and condition of the vehicle. The presence of such noise results in a situation where soft sounds of interest are hidden, the perceived loudness is reduced and the intelligibility of the signal is lessened.

The vehicle's driver and/or passengers may compensate for increased external noise by increasing the volume of the audio system. However, when the vehicle speed decreases or another source of external noise is alleviated, the audio system's volume will be too high, requiring the user to reduce it. A frequent need to increase and reduce the volume is an inconvenience and can also be a safety hazard because it distracts the driver's attention. Thus, a system to automatically compensate for external noise by raising and lowering audio system volume makes driving both more convenient and safer.

Prior attempts to eliminate or reduce the effects of noise on sound signals reproduced in moving vehicles include a scheme known as "automatic level control," which automatically raises the volume when the vehicle is noisy. There are two major problems with such prior art systems.

First, these systems seldom determine the noise level properly because they use inaccurate means of estimating or measuring the noise level. Some automatic level control systems known in the prior art predict the noise level based on vehicle data such as speed, window status, gear ratio, etc. Such a measurement method may lead to incorrect noise estimates since many conditions, such as vehicle age, tire selection, and weather conditions, are overlooked.

Other prior automatic level control systems measure the noise level outside the vehicle. This method can lead to gross errors in the noise estimate, depending on the condition of the soundproofing of the car and other conditions, such as whether the windows are open. Other automatic level control systems known in the art measure the sound level inside the vehicle, which is the sum of the music and noise level. If the predicted music level is subtracted from the total noise level, an approximation of the noise level can be made. This technique requires careful calibration. Errors can cause a problem called "gain runaway," where increases in the music level are misconstrued as increases in the noise level, thereby leading to further increases in the music level.

The second major problem with automatic level control systems known in the prior art is that they do not provide a means to measure the music level. As will be shown herein, it is critical that any such system have complete and accurate measurements of both noise level and music level in order to accurately predict the impairment caused by the noise.

Systems known in the prior art to compensate for external noise use compression techniques to reduce the dynamic range of the reproduced signals. Such systems are also insufficient, as they are unable to differentiate between the music and the noise present in the vehicle. Sound quality is noticeably impaired since the music signal is audibly compressed when the vehicle is noisy. Such a compressed music signal does not sound the same as a non-compressed signal played in a quiet car.

When noise is present, reproduced music (or any other audio signal) appears to be lower in loudness than it actually is. The extent of loudness change was measured by Hellman and Zwislocki in Loudness Function of a 1000-cps Tone in the Presence of a Masking Noise. Journal of the Acoustical Society of America, pp. 1618–27, vol. 36, No. 9, Sept. 1964 and is shown in FIG. 18. Such changes are also discussed in *Handbook of Perception*, ed. Canteetta and Friedman, Vol. 4 (1978). The amount of signal level reduction is a function of the signal to noise (S/N) ratio. If the signal level is raised an amount equal to the perceived level shift caused by the noise, the correction will be transparent to the listener, and the reproduced sound will appear to be unchanged by the noise.

Implementations known in the prior art for compensating for such noise have all used analog detection techniques which do not differentiate between the music and the noise. Thus, the masking effect of the noise was incorrectly estimated. In contrast, the present invention uses digital filtering techniques which measure the true noise level in the vehicle.

SUMMARY OF THE INVENTION

It is an object of this invention to create a system that automatically Compensates for the noise level inside a vehicle. It is a further object of this invention to create such a system which accurately measures the music level in the vehicle. It is a further object of this invention to create such a system that accurately measures the noise level in the vehicle through the use of analog to digital conversion and adaptive digital filtering. It is a further object of this invention to create such a system that compensates for increases or decreases in the noise or music levels.

The present invention comprises a system known as "dynamic sound optimization" (DSO) which digitally processes electrical audio signals to compensate for the intrusion of acoustic noise into a listening area. Such a system could be used with any audio system and any listening environment. For the purposes of simplicity, we refer to the output of the audio system as the music signal and the listening environment described herein is a vehicle cabin. It is understood that the invention is not so limited, as it could be used in other listening environments, such as a room, as well. This invention should be read as limited by the claims only.

The DSO system in accordance with the present invention comprises the following elements: a sensing microphone in the vehicle cabin to measure both music and noise; preamplification and analog to digital (A/D) conversion of the microphone signal; A/D conversion of a stereo music signal; a pair of filters that use an adaptive algorithm such as the Least Mean Squares ("LMS") method to extract the noise from the total cabin sound; an estimation of the masking effect of the noise on the music; an adaptive correction of the music loudness and, optionally, equalization to overcome the masking effect; digital to analog (D/A) conversion of the corrected music signal; and transmission of the corrected music signal to the audio system. Each of these elements will be disclosed in more detail below. It is to be understood that the analog to digital conversion of certain signals, such as the music signal, is not necessary if the music signal is already a digital signal from, e.g., a compact disc player or other digital signal source.

The DSO system in accordance with the present invention continuously measures the loudness of the music and noise in a vehicle and determines the effect of the noise on the perceived loudness of the music. The system then boosts the level of the music to compensate for the masking effect. The loudness of the music is determined by monitoring the music signal voltage coming from the music source. The sound in the vehicle consists of both music and noise as measured by the microphone. The microphone signal is converted to a digital representation, and the system uses digital processing to remove the music signal with a pair of adaptive filters.

The system disclosed by the present invention includes hardware and appropriate software to shape the spectrum of the music and noise signal to mimic human hearing. The energy content of these signals is then compared and used to determine the threshold of a compressor. When the music signals are below the threshold, gain is applied. When the music signals are above the threshold, there is no gain applied. When the music is much louder than the noise, no compression is used. As the music level approaches the noise, the amount of compression is raised.

There are times, such as when the music is very soft or is between selections, where the signal coming from the music source will consist largely of residual noise. Large increases in gain are not desirable because they will make this noise audible. Two techniques are used to prevent such increases in gain. First, the system imposes a limit on the maximum gain that the compressor can apply to the signal. Second, when the music signal is below a set threshold, the compressor will ignore any further decreases in music level. During this time, the compressor will still respond to changes in the cabin noise. This method provides the best combination of source noise masking while keeping music program audible.

The present invention also provides for a system that adjusts not only gain but equalization in response to the noise. The perception of high frequencies is not greatly affected by road noise, but bass frequencies are strongly masked. A simple enhancement would apply bass boost that is proportional to the overall gain. A more accurate system would comprise two complete DSO systems, one operating above the bass region, and one operating strictly in the bass region. In addition, there should be a mild high frequency roll off proportional to the gain. These frequency adjustments can be accomplished using filters with adjustable shelving responses.

DETAILED DESCRIPTION OF THE DRAWINGS

Figure 1:
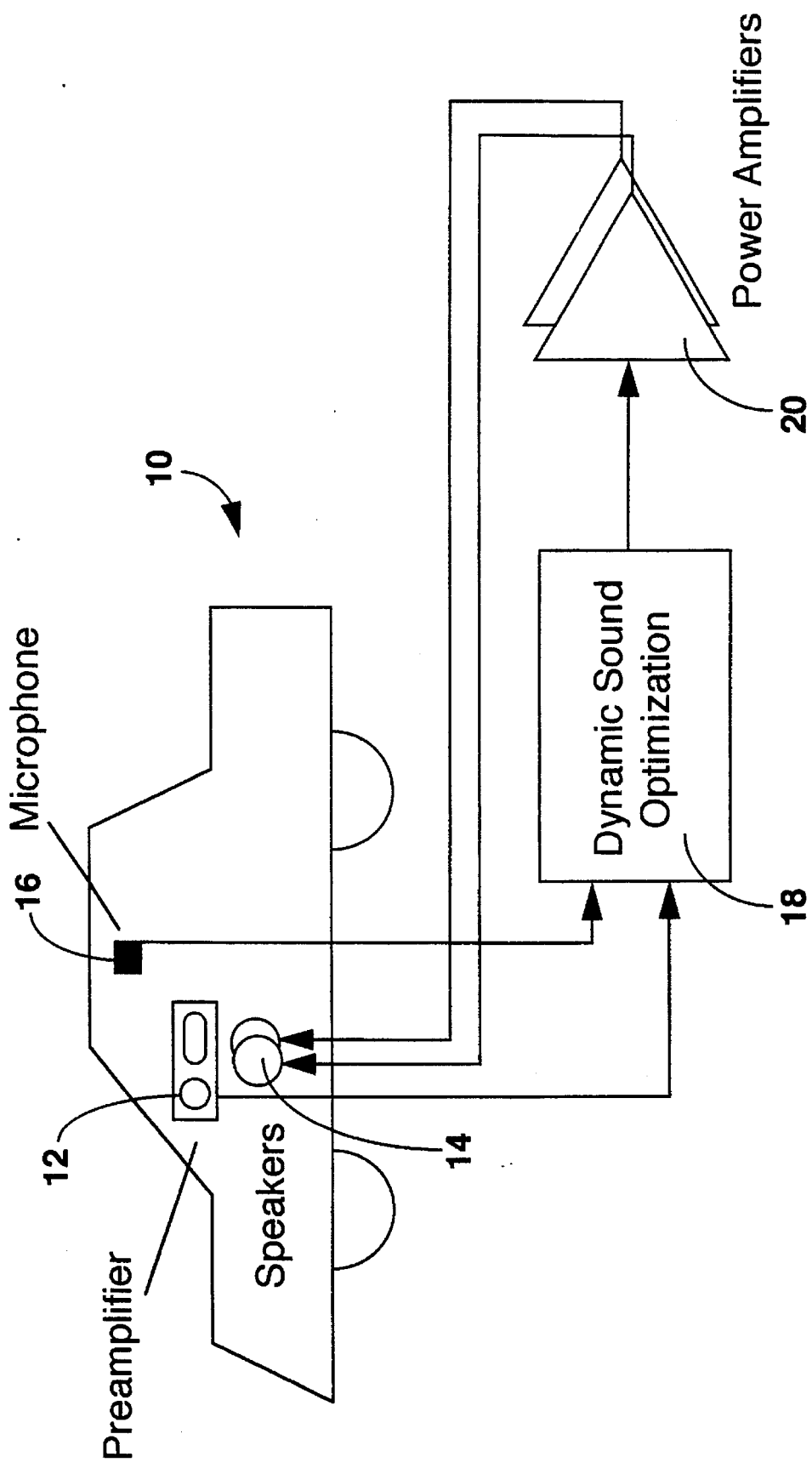
FIG. 1 is a block diagram showing the installation of the DSO system in a vehicle in accordance with the present invention.

FIG. 1 is a block diagram of an overview of the DSO system contemplated by the present invention. Specifically, FIG. 1 shows vehicle 10 which incorporates a standard preamplifier 12 and speaker(s) 14. The present invention may be used with any standard audio system incorporating the elements set forth herein. Microphone 16 and preamplifier 12 are input to box 18 which is a representation of the system wherein the various software and hardware elements of this invention are incorporated. These elements are described in detail below. The box 18 could be incorporated as part of the audio head unit in the vehicle or as a separate component.

Microphone 16 should be located in the vehicle in a position such as above the head of the listener to most closely approximate the sound heard by the listener. The output of box 18 is sent through a standard power amplifier 20 to the speakers 14. The hardware incorporated in the DSO system as Shown in FIG. 1 can be a special purpose chipset, or it can be an available processor board, such as the ARIEL DSP-96. Minor modifications described below, such as the addition of a third input, will need to be made to such currently available boards for use in this invention.

Figure 2:
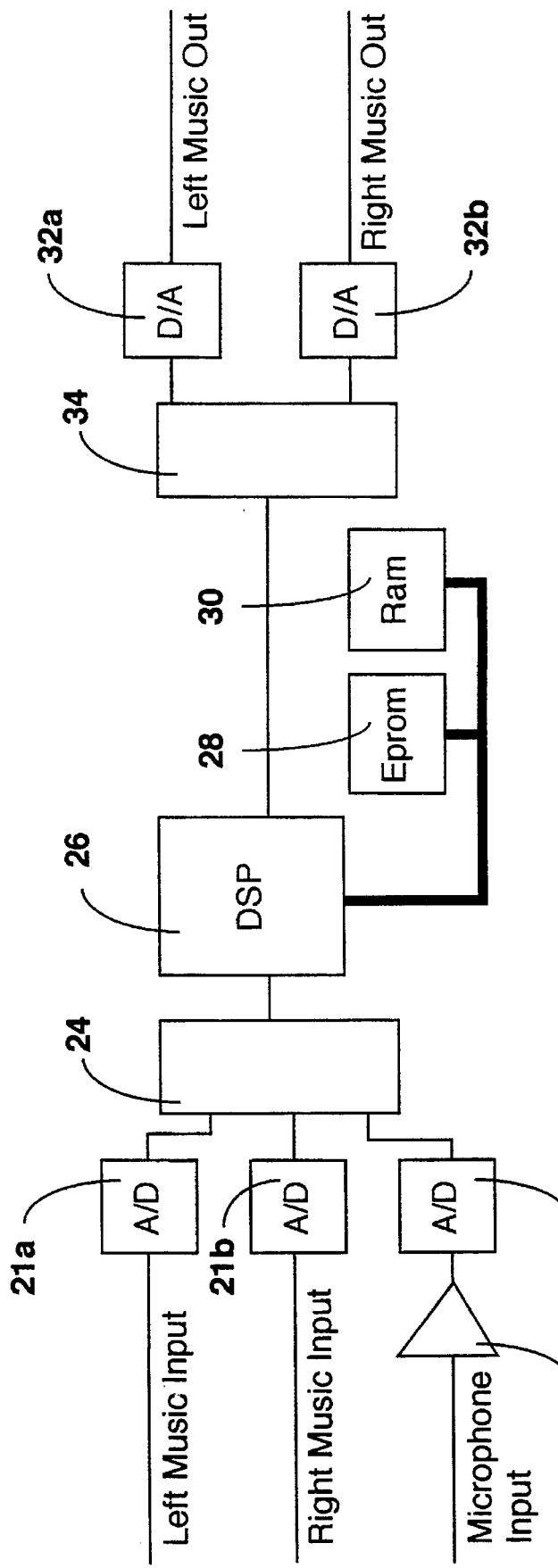
FIG. 2 is a block diagram showing the layout of the hardware incorporated in a first embodiment of the DSO system according to the present invention.

FIG. 2 is a block diagram of the basic hardware essential to this invention. This hardware includes three analog to digital (A/D) converters 21a, 21b and 21c. As shown in FIG. 2, A/D converter 21a receives the left music input, A/D converter 21b receives the right music input, and A/D converter 21c receives the input from microphone preamplifier 25, which receives the input from microphone 16. The output from all three A/D converters is transmitted to multiplexer 24, and the signal therefrom is sent to microprocessor 26, which is optimized for signal processing and which is connected to an EPROM 28 used to store the instructions for microprocessor 26, RAM 30 to hold audio samples for processing, and some certain logic chips (not shown) to support the above mentioned devices, and to connect the microprocessor to the A/D converters 21a, 21b and 21c and to D/A converters 32a and 32b, for the left and right system output signals, respectively, through second multiplexer 34.

Figure 3:
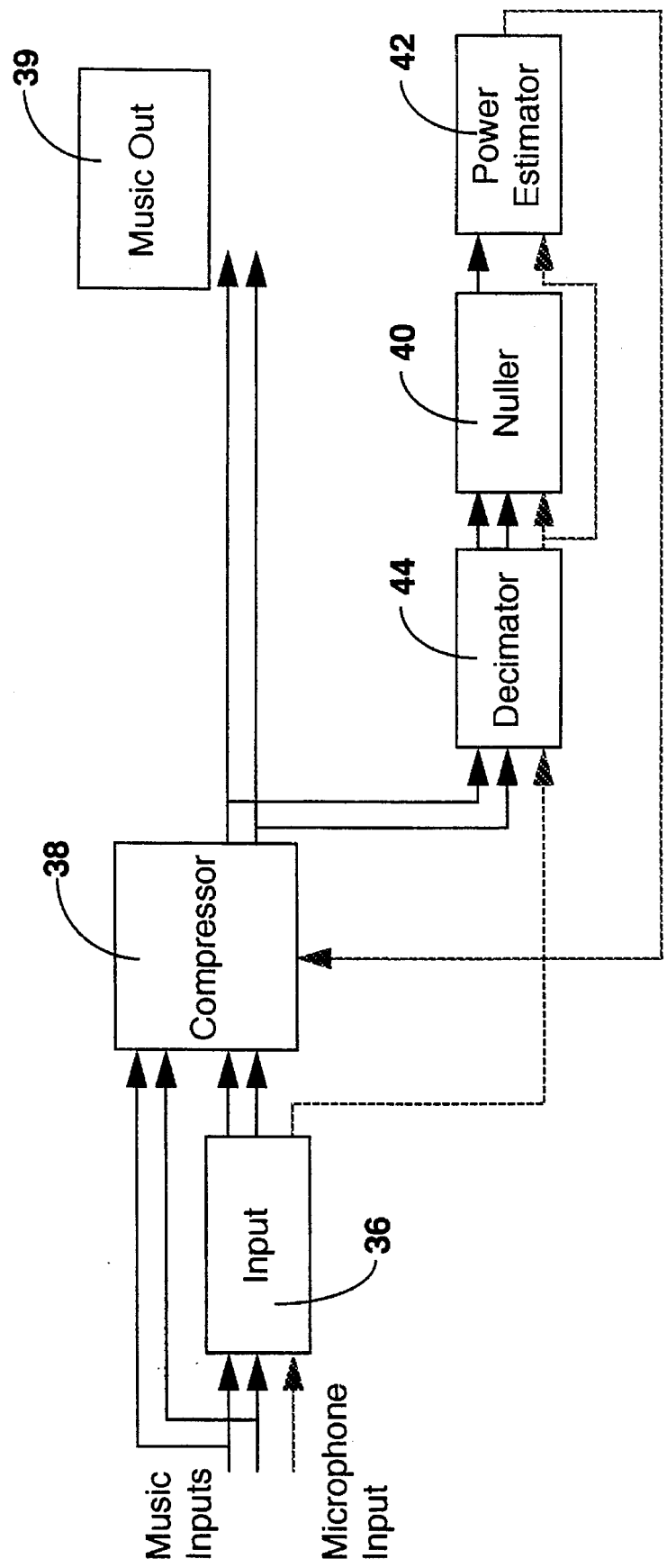
FIG. 3 is a block diagram showing the layout of the software incorporated in a first embodiment of the DSO system according to the present invention.

FIG. 3 shows a block diagram of the unique DSO software which is incorporated into microprocessor 26 and which provides the many functions of this invention. The DSO system software can be broken into five major subsystems, namely the input 36, compressor 38, nuller 40, power estimator 42 and decimator 44. These general elements of the software are known in the art, and each element, including the unique modifications thereto, are shown in more detail in figures described below.

Figure 4:
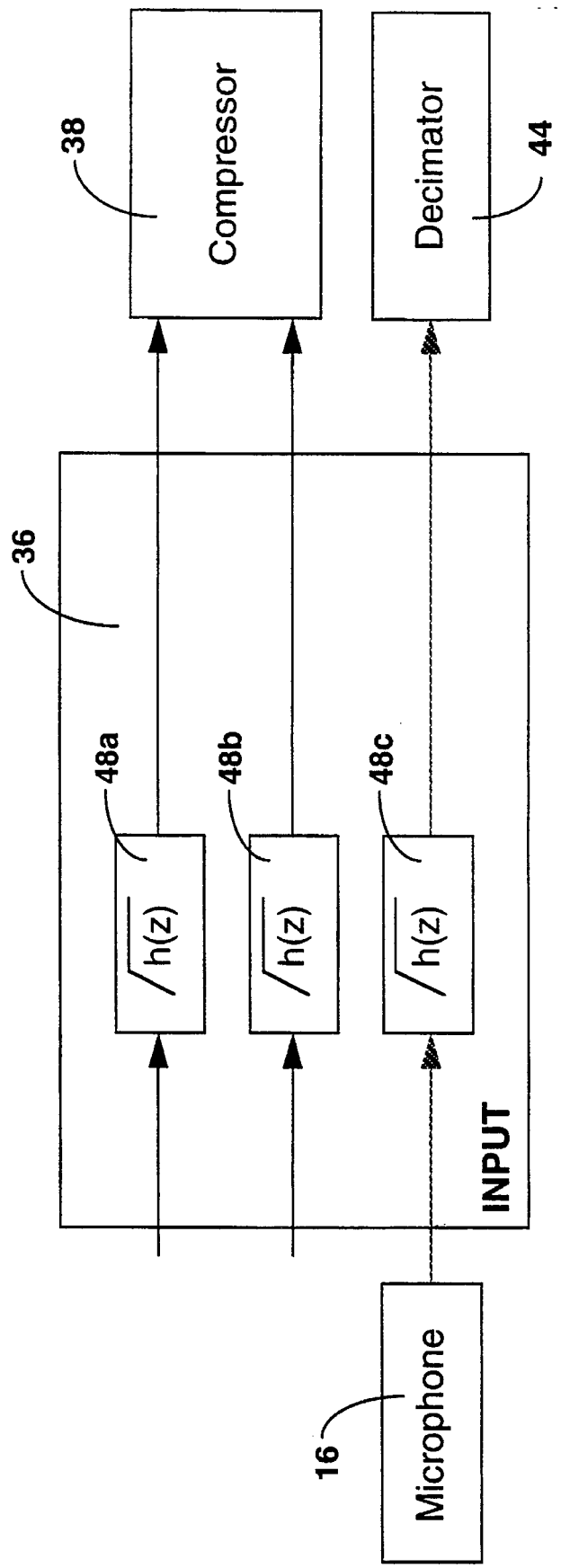
FIG. 4 is a block diagram showing the layout of the input element of the software incorporated in a first embodiment of the DSO system according to the present invention.
Figure 10:
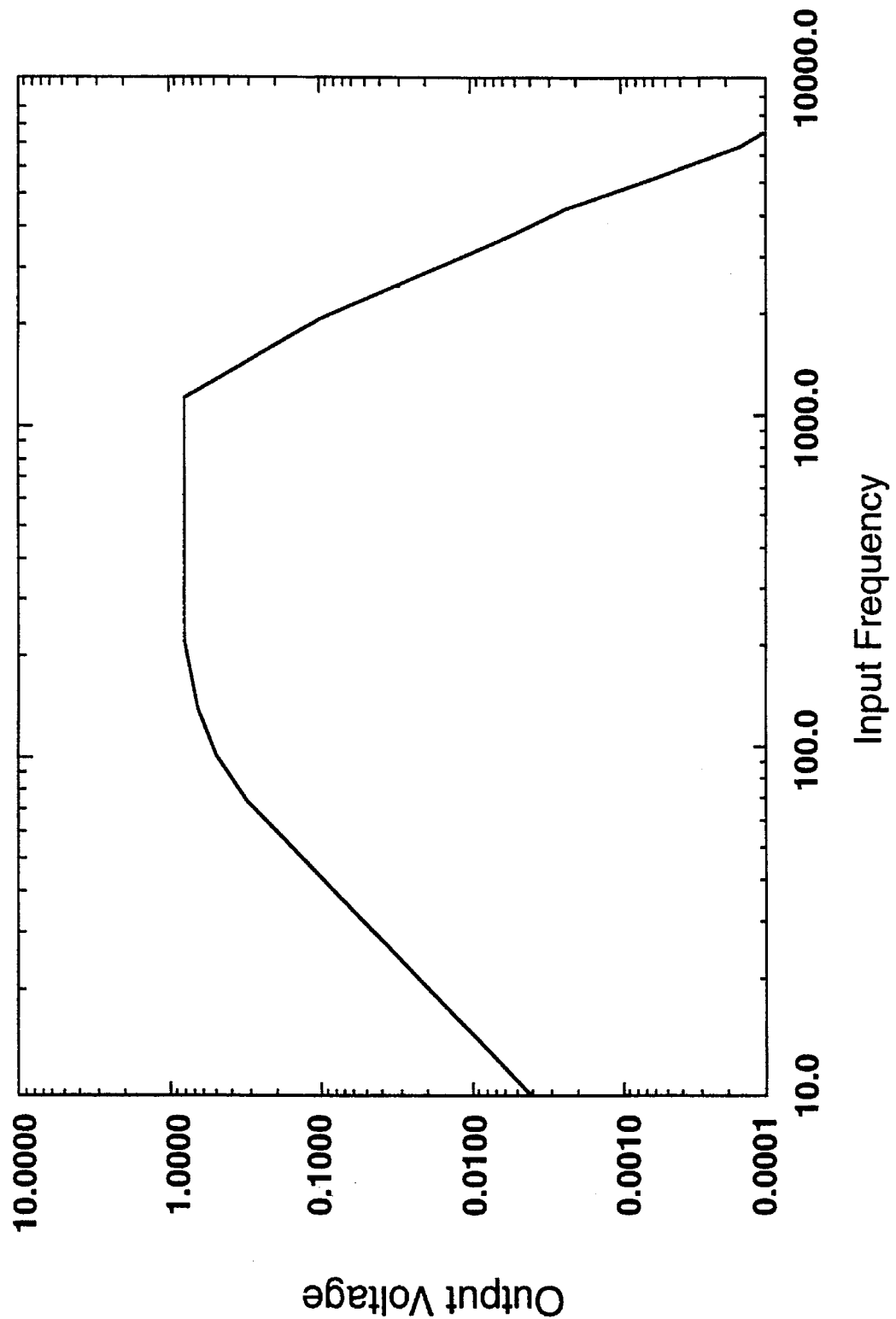
FIG. 10 is a graph demonstrating the gain curve of the frequency response of the input and decimating filter incorporated in the present invention.

FIG. 4 is a block diagram of the software referred to as input 36. As shown here and in FIG. 3, input 36 receives the inputs from the music source, and specifically from preamplifier 12, and from microphone 16. Input 36 includes high pass filters 48a, 48b and 48c, which are used to mimic the human ear's insensitivity to low frequencies, as shown in FIG. 10. The filter represented in FIG. 10 is an approximation of the inverse of the equal sensation curves shown in FIG. 19.

Figure 5:
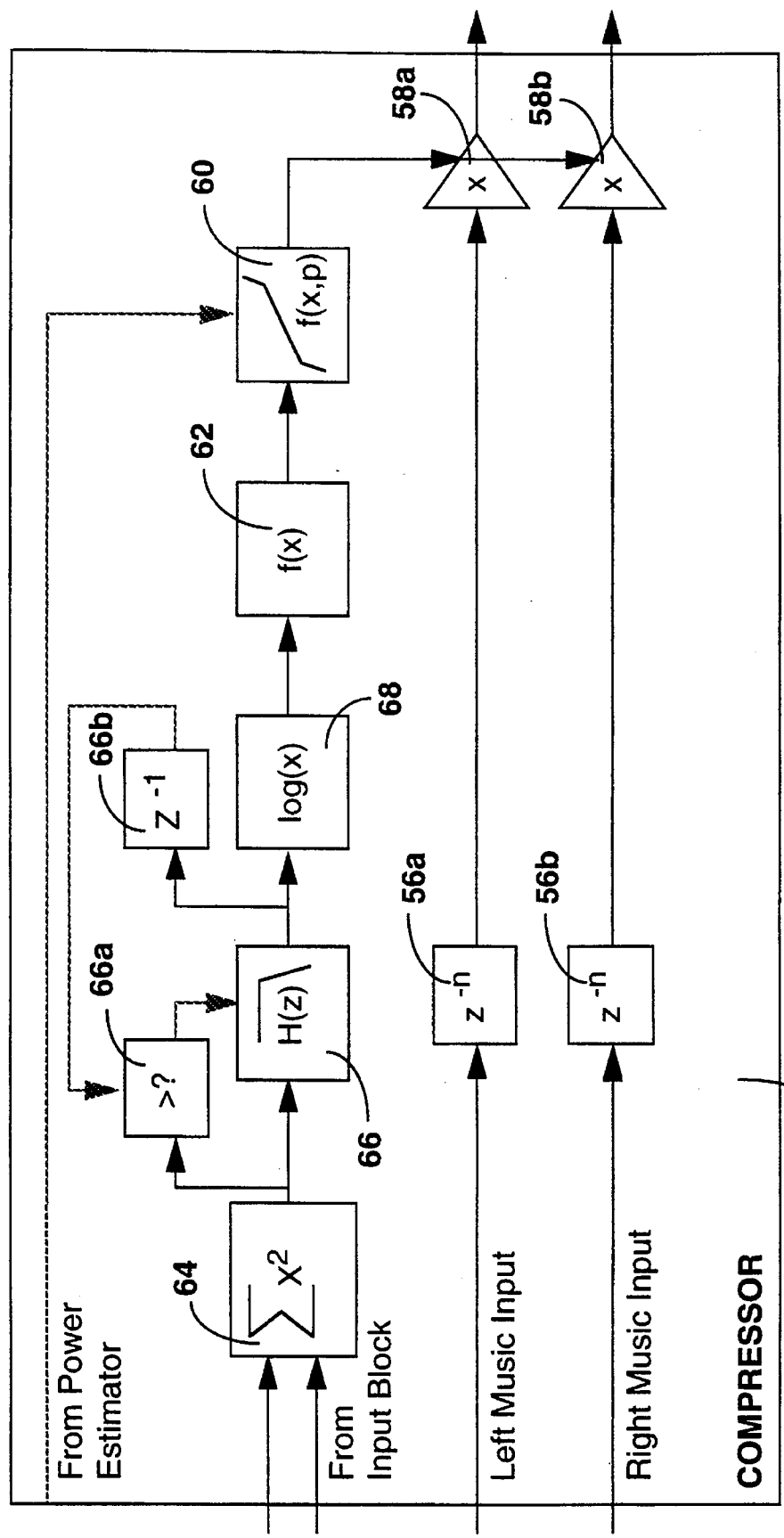
FIG. 5 is a block diagram showing the layout of the compressor element of the software incorporated in a first embodiment of the DSO system according to the present invention.

FIG. 5 is a more detailed block diagram of the software referred to as compressor 38. The filtered and unfiltered music signals from input 36 and preamplifier 12, respectively, are passed into compressor 38. The filtered signal from input 36 is essentially the music signal with the bass element filtered out to mimic the ability of the human ear to hear sounds, as it is not very sensitive to low frequencies. As discussed above, this is performed by high pass filters 48a, 48b and 48c as shown in FIG. 4. This enables the DSO system to make an assessment of the sound level based on how the human ear would perceive the music signal, resulting in a more accurate decision-making process. Compressor 38 also receives the output of noise power estimator 42, the function and operation of which is described in detail below. The essential information in the input from power estimator 42 to gain calculator 60 is an estimate of the actual noise level in the vehicle.

The power of the music signal from input 36 is calculated as shown in blocks 64, 66 and 68 in FIG. 5. The signal is squared in block 64, integrated over time in block 66, and is converted to a logarithm in block 68.

The integrating time used in integrator 66 is changed according to whether the signal is increasing or decreasing. Block 66a compares the current sample from block 64 with the last sample from block 66b to determine whether the signal is increasing or decreasing. Block 66b represents a one sample time delay. Shorter integration time is used (approximately 10 millisecond) during an increase (or "attack") in the signal. A longer time (approximately 1 second) is used during a decrease (or "decay") in the input signal. The times are selected for a musically pleasing effect, and to prevent the system from reacting too quickly to quiet passages, which would sound unnatural, while also allowing the system to react quickly to a large increase in the music loudness to reduce the overall volume to an acceptable level. While these are the preferred values, other values could be chosen depending on the designer's preferences.

When the output of integrator 66 falls below a fixed threshold, a minimum value is substituted. This prevents compressor 38 from amplifying the residual noise in the music signal to an audible level. During such substitution, the compressor can still raise the gain if the car noise increases, but the compressor will not respond to further decreases in the music level.

Minimum level limit 62 is a function which prevents the system from over-amplifying the music signal at times when it is undesirable, either between selections or when the volume control for the audio system is turned down but there is still a small amount of background noise in the system.

Thus, minimum level limit 62 simply does not allow the power estimate of the music signal to drop below a certain level.

It is important to note that the calculations performed on the signal from input 36 before it is transferred to gain calculator 60 are essentially identical to the calculations performed on the noise signal before it is transferred from power estimator 38 to gain calculator 60 in compressor 38. Thus, gain calculator 60 receives both the modified noise signal from power estimator 42 and the derived music signal from input 36. It then compares these two signals to determine when the music level should be adjusted. This information controls amplifiers 58a and 58b, which adjust the level of the music signal. As shown in FIG. 3 the music signal from compressor 38 is sent both to the system output, and thus through speakers 14, and to decimator 44, the functions of which are described below.

The inputs from preamplifier 12, which consist of the actual left and right music signals, are passed through delay lines 56a and 56b before they reach amplifiers 58a and 58b. This delay allows time for the processing of the signals from power estimator 42 and input 36. This gives the gain calculation subsystem the ability to "look ahead", and respond to changes in the music signal. For example, if the music signal were to suddenly increase, the compressor gain should correspondingly decrease. Since the time to decrease the gain is limited by the attack integration time, the onset of the louder music would not be processed with the correct gain. With the addition of the look ahead feature, the gain can be decreased before the music passes through the gain element. The time delay should be at least equal to the attack time constant.

Figure 9:
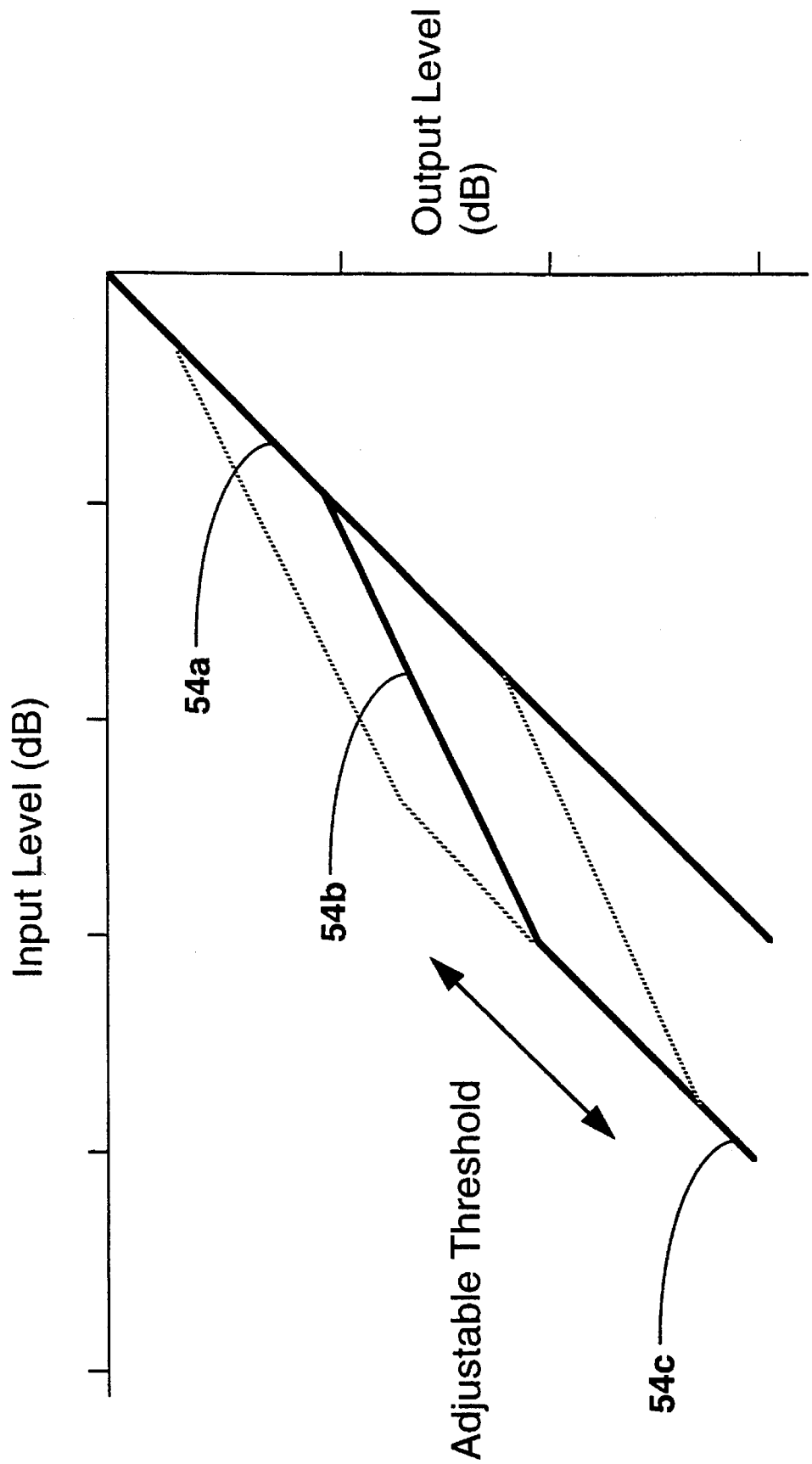
FIG. 9 is a graph demonstrating the gain curve of the compressor incorporated in the present invention.

FIG. 9 shows the preferred gain curve to be created by the compressor 38 used in this invention. Axis A represents the input level from input 36 and Axis B represents the music output as shown in FIG. 3. It can be seen that at low levels of input the output is increased by a corresponding amount. This region is designated as Section 54c on FIG. 9. Above a certain input level, further increases in input result in smaller increases in the output, as shown in Section 54b.

Finally, the input reaches a level where further increases result in essentially equal increases in the output, as shown at Section 54a. The gain of the compressor curve can vary between unity and a predetermined maximum, which is the maximum gain. The point where the gain starts moving away from the maximum is the threshold.

Figure 7:
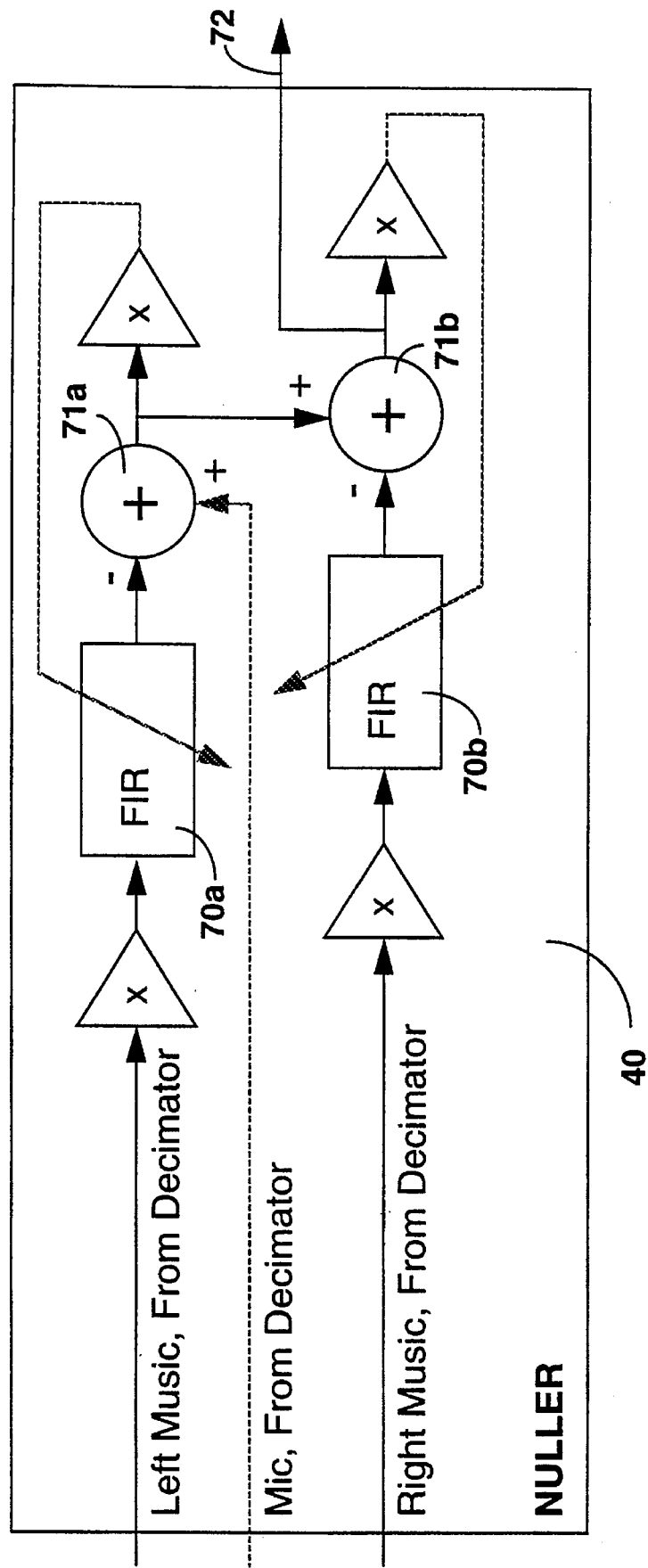
FIG. 7 is a block diagram showing the layout of the nuller used in a first embodiment of the DSO system according to the present invention.

FIG. 7 is a block diagram of the hardware referred to as nuller 40, which employs adaptive filters (such as those using the least mean squares ("LMS") method) to estimate the noise content in the signal samples received from microphone 16. Other algorithms which could possibly be used include, but are not restricted to, the recursive least squares, QR decomposition least squares, least squares lattice, QR decomposition lattice or gradient adaptive lattice methods. Such methods are described by Haykin in *Adaptive Filter Theory*, Prentice Hall (2d ed. 1991). Such filters have been used in the prior art but not for calculation of noise in a vehicle sound system. Previous uses of such systems have included medical equipment such as heart monitors, where it is necessary to separate the desired signal from noise on the monitor such as interference created by an electrical current. In such applications the noise signal is generally fixed or easily determined. In the present invention, the noise signal from microphone 16 includes not only external noises, but also includes the music signal after it has been transmitted through the speakers 14 and has been reflected by the various surfaces of the vehicle's cabin. The adaptive filter is used to remove the music signal (and all of its reflections) from the signal picked up by microphone 16.

An adaptive filter consists of a delay line with a number of weighted taps along its length. All taps are summed to form a single output. The weights of the individual taps are continuously adjusted to minimize an error signal. The error signal is calculated by subtracting the output of the filter from a reference signal. In this case, the taps are adjusted to minimize the music output of filters 70a and 70b.

Nuller 40 receives both music and noise signals through decimator 44. The left audio signal is processed by the first adaptive filter 70a and the result is subtracted from the microphone signal at block 71a. The resulting signal is transmitted back to adaptive filter 70a and is used to adjust the tap weights.

The right audio signal is processed by a second adaptive filter 70b. The signal from block 71a, which is essentially the noise signal from microphone 16 with the left music signal removed, is then sent to block 71b, and the output of filter 70b is subtracted from the signal from block 71a at block 71b. The resulting signal from block 71b is transmitted back to adaptive filter 70b for the same type of corrective action with regard to the right music signal as was performed on the left music signal as described above for adaptive filter 70a. The nuller output signal 72 is the output from block 71b and represents the noise signal from the microphone 16 with both left and right music signals removed, and thus it accurately represents the noise in the passenger cabin.

Figure 6:
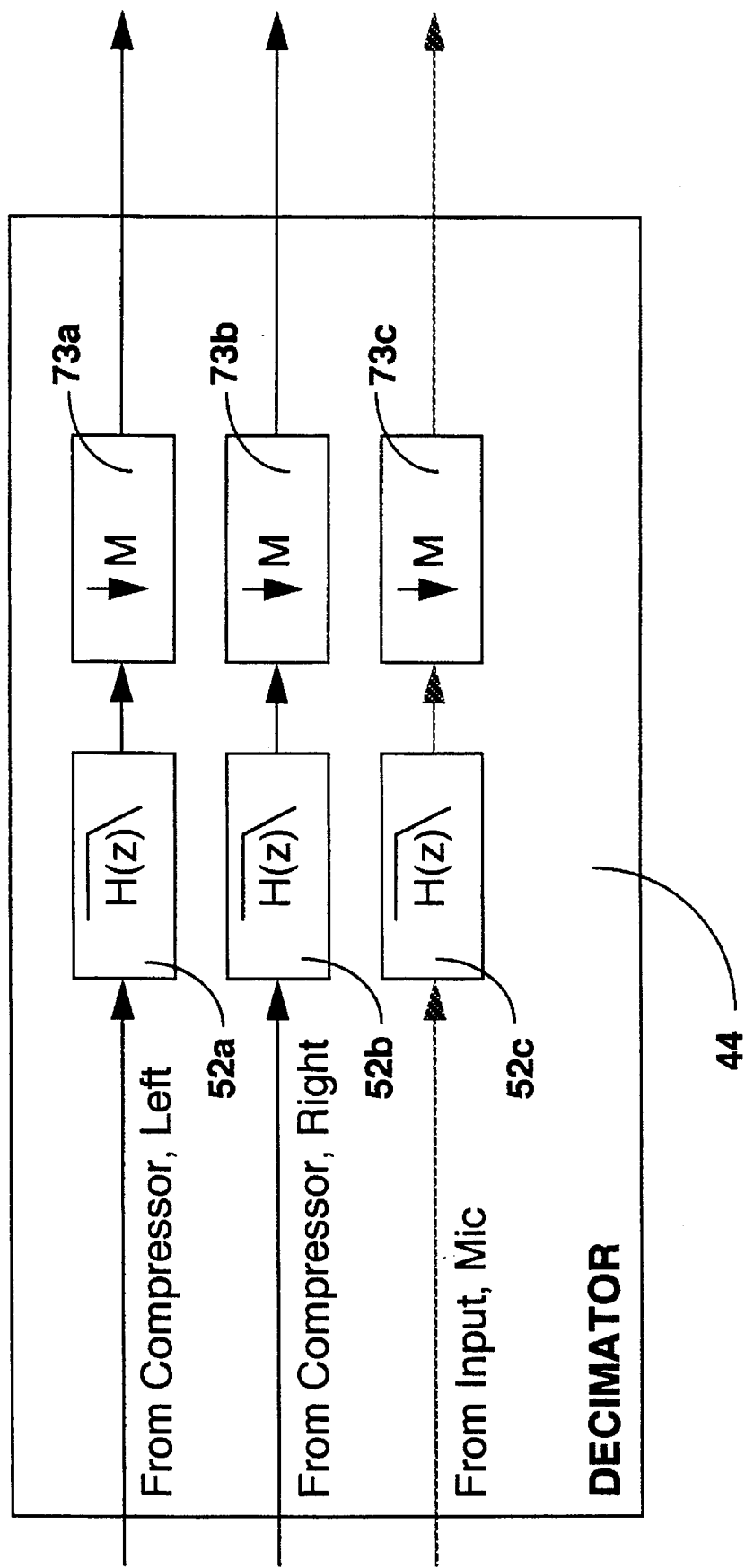
FIG. 6 is a block diagram showing the layout of the decimator used in a first embodiment of the DSO system according to the present invention.

The functioning of filters 70a and 70b can require a great deal of microprocessor time. Thus it is necessary to limit the number of computations which these filters need to perform. After filtering, samples of data may be systematically discarded while preserving the information content of the signal. This function is performed by decimator 44, a block diagram of which is shown in FIG. 6. Decimator 44 includes low-pass filters 52a and 52b to. filter the music signals received from compressor 38 and low pass filter 52c to filter the signal received from microphone 16. Samples are discarded in blocks 73a, 73b and 73c, which represent downsampling in the digital domain. This decimation of the signal reduces the computational load on the adaptive filters in nuller 40 by a factor of approximately 7, while still giving an accurate estimate of the music and noise levels. The graph shown in FIG. 10 represents the frequency response gain curve of high pass filters 48a, 48b and 48c, combined with low pass filters 52a, 52b and 52c as incorporated in this invention.

Figure 8:
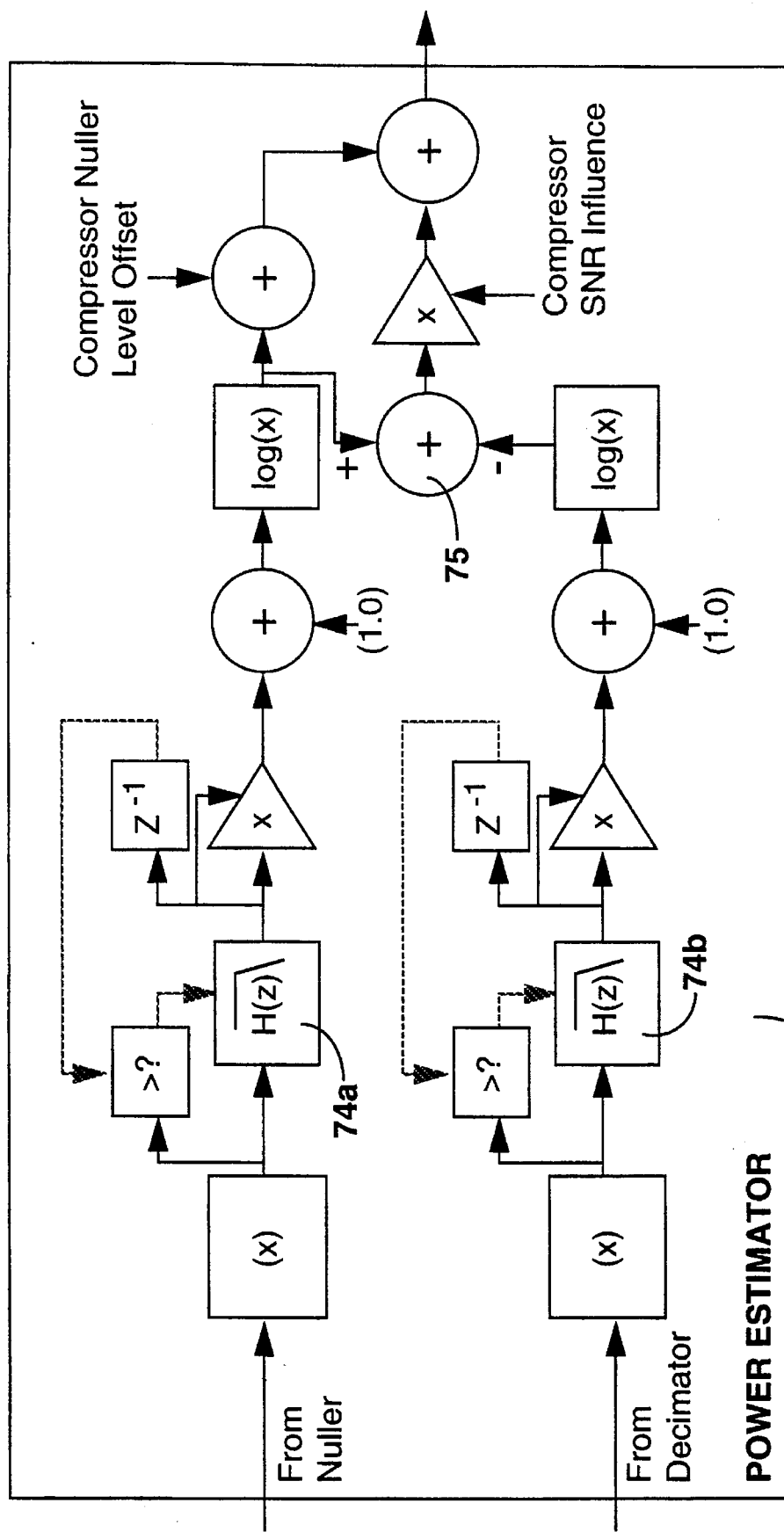
FIG. 8 is a block diagram showing the layout of the noise power estimator used in a first embodiment of the DSO system according to the present invention.

As shown in the block diagram in FIG. 3, the output of nuller 40 (i.e., the noise signal) and the signal from microphone 16 are sent to the power estimator 42, which is shown in detail in FIG. 8.

The power of the noise signal from nuller 40 and the power of microphone signals from decimator 44 are calculated in an identical manner, which is very similar to the calculation used for the music signal in compressor 38 as shown in FIG. 5. This calculation is performed by taking the absolute value, integrating over time, squaring, adding 1, and applying a logarithmic conversion.

Integrators 74a and 74b include controls on the attack and release times which are similar to those used in compressor 38. The integrating time is changed according to whether the signal is increasing or decreasing. One problem that this invention overcomes is the situation in which an external noise source dramatically increases the noise level inside the vehicle for a short period of time. For example, the noise level will increase if the vehicle is driven over a short stretch of rough pavement. However, the audio system should not increase the audio music level to compensate for this increased noise level due to its short-term nature. Thus, in this invention, longer integration time (e.g., approximately 3 seconds) is used during an increase (or attack) in the noise signal. A shorter integration time (e.g., approximately 0.5 second) is used during a decrease (or decay) in the noise signal. The longer integration time is used to prevent the system from increasing the loudness of music when short term interference is present. The same effect is present in the attack and release controls in compressor 38, which are used to limit the perceived changes in the music signal. However, they are applied in the opposite fashion for the music and noise signals.

As shown in FIGS. 5 and 8, the output from power estimator 42 is sent to compressor 38 for use in determining the gain in gain calculator 60. The compressor threshold is determined by the noise signal power estimate offset by the "nuller level offset" parameter. The nuller level offset is set to match the threshold of perceptual masking, as determined through listening tests.

As shown in FIG. 8, the signal resulting from integrator 74b is compared to the signal from integrator 74a by comparator 75. The use of integrator 74b on the input from microphone 16 is a check on the system which allows for compensation in situations such as where the acoustics of the vehicle change dramatically when, e.g., someone momentarily puts their hand close to the microphone. Without such a check on the system, the system could misinterpret increases in the music level as increases in the noise level, resulting in a situation referred to as the "gain chase scenario." The gain chase scenario occurs when nuller 40 fails to completely remove the system audio input (i.e., the music) from the microphone signal. In this case, an increase in the music level will lead to a decrease in the calculated signal to noise ratio, which leads to an increase in the compressor gain, which in turn leads to an increase in the music signal level, ad infinitum.

To eliminate this problem, the output of power estimator 42 is decreased by the estimate of the signal-to-noise ratio (the microphone signal power estimate less the noise signal power estimate) multiplied by the "SNR influence" parameter. The "SNR influence" parameter helps retard the gain chase scenario when the nuller cannot achieve better performance in high signal-to-noise situations. The SNR influence parameter is set as low as possible, while still maintaining system stability.

The system disclosed in the present invention can be self-calibrating through measurements of the sensitivity of the audio reproduction system (i.e., power amplifiers and speakers). The ratio of the DSO system output voltage to the sound pressure in the listening area is the only factor needed to adjust the DSO system to a particular installation. Such a measurement can be made by using electronically generated noise or music as a test signal. The calibration can be performed whenever the test signal is 10 dB louder than any interfering noise in the cabin. Such a measurement could be made during normal listening in the vehicle using the DSO hardware and additional software.

The above disclosure demonstrates the benefits of the preferred embodiment of this invention. Additional embodiments incorporating the same software as described above can be used with the addition of some hardware units or reconfiguration of existing hardware. It has been noted that the process of adding gain after quantization (which occurs in the analog to digital conversion) has the effect of decreasing the overall signal to noise ratio, thus resulting in an increase in extraneous noise in the audio system signal. This is particularly true with less expensive A/D converters as might be required to be used in such a system due to cost constraints.

There are several techniques which are used in the above-described system to prevent such a S/N ratio decrease without the use of expensive multiple bit A/D converters. First, the system puts a limit on the amount of gain which will be applied to the output, as shown by minimum level limit 62 shown in FIG. 5 and described herein. As shown in the graph in FIG. 9, the system does not further compress the signal after a certain point is reached. These techniques help to mask the additional noise present in the output signal due to the decreased S/N ratio, and are acceptable for most applications.

Figure 11:
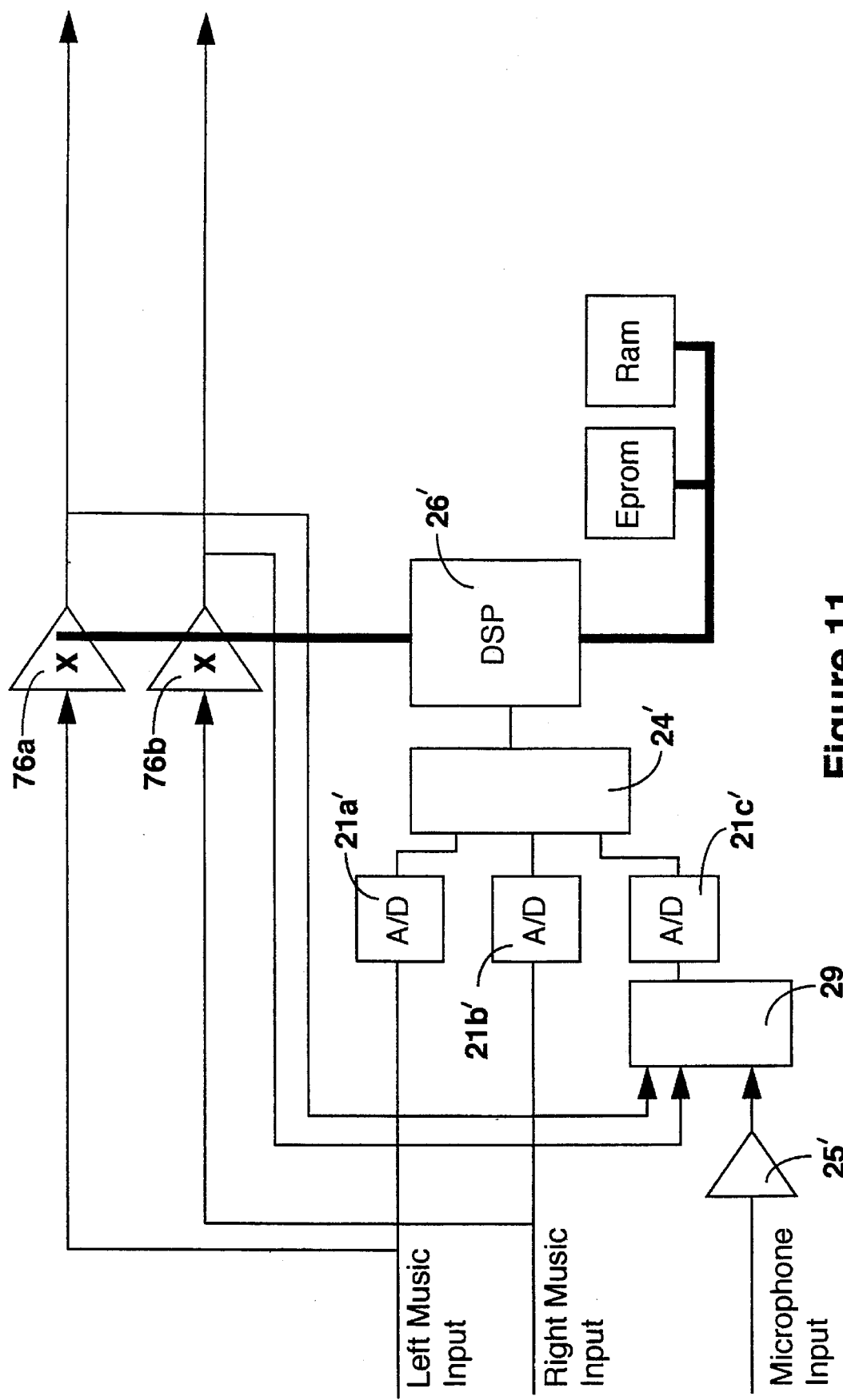
FIG. 11 is a block diagram showing the layout of the hardware incorporated in a second embodiment of the DSO system according to the present invention and incorporating a digitally controlled amplifier.
Figure 12:
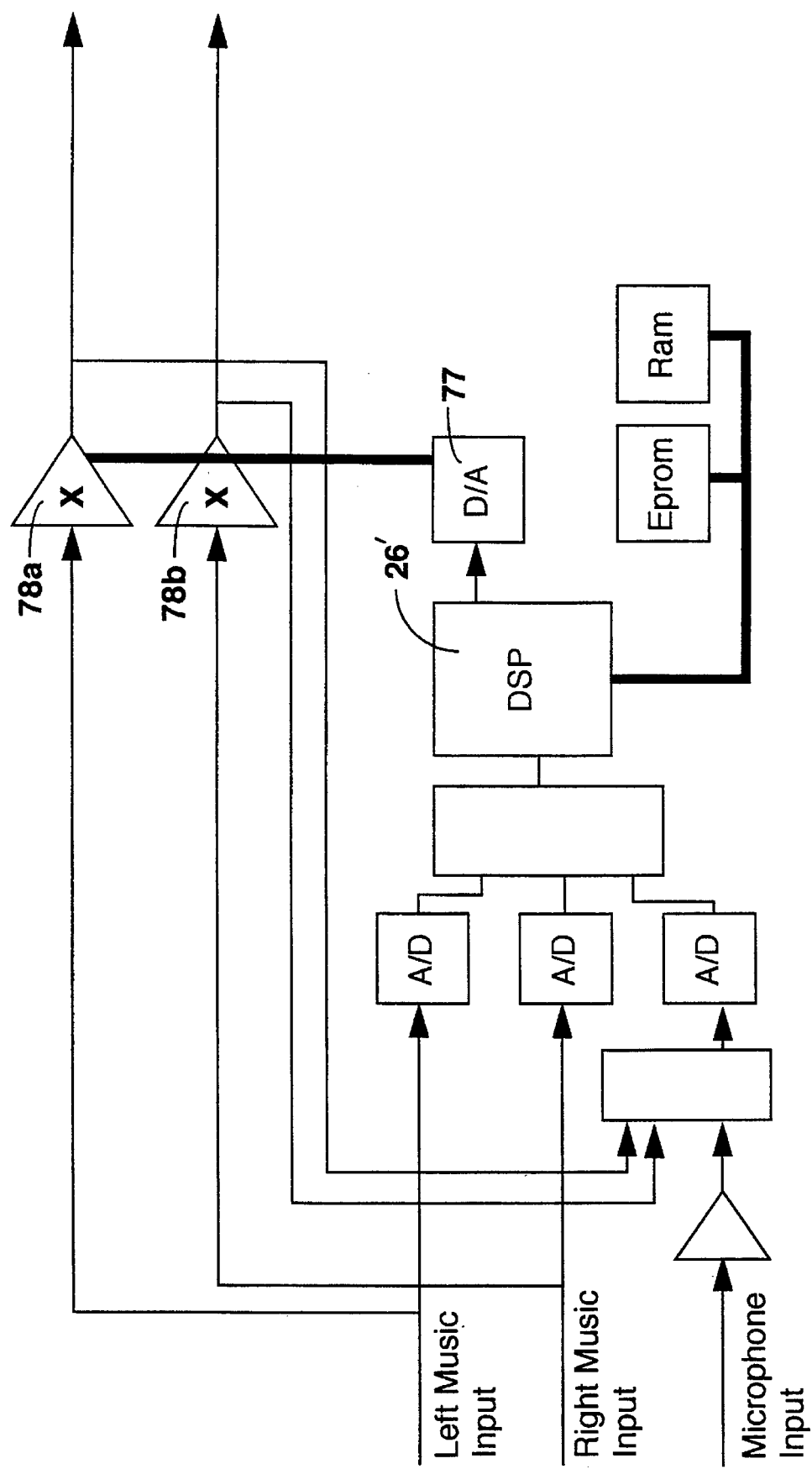
FIG. 12 is a block diagram showing the layout of the hardware incorporated in a third embodiment of the DSO system according to the present invention and incorporating a voltage controlled amplifier.

FIGS. 11 and 12 show alternative embodiments of this invention which use different means of producing the necessary gain to reduce this problem of extra noise in the output signal due to the application of gain after the signal has been converted to digital. In essence, the embodiments shown in FIGS. 11 and 12 apply the gain to the signal when it is in analog form, while the abovedescribed analysis of the various signals is still performed after digitization.

FIG. 11 is similar in many respects to the overall system layout shown in FIG. 2, and identical elements disclosed therein use identical reference numerals primed. FIG. 11 shows the use of digitally controlled amplifiers (DCA) 76a and 76b. The gain is controlled by codes from DSP 26'. Because the actual audio system signal is never converted to digital, the signal to noise ratio of the music output is not limited or reduced by the quantization of the A/D converters. The output of the DCAs 76a and 76b is A/D converted through transmission through multiplexer 29 and A/D converter 21c', and the resulting digital signal is sent to the input of the decimator, which is not shown in FIG. 11 but described above. A further embodiment could eliminate the need for the A/D conversion of the output signal from DCA 76 by simulating the effect of the DCA in software embodied in DSP 26'. The DCA simulator would take the output of the input block and multiply it before sending it to the decimator.

FIG. 12 shows a system identical to that shown in FIG. 11, except that the output signal from DSP 26' is transmitted through another D/A converter 77 and an analog voltage controlled amplifier (VCA) 78a and 78b, rather than DCA 76. The benefit of this approach is that the output of D/A converter 77 is an analog signal that provides continuous control over gain. In contrast, the DCA produces discrete gain changes. If the system is not tuned properly, the resultant incremental changes in system output may be noticeable to the listener.

Figure 13:
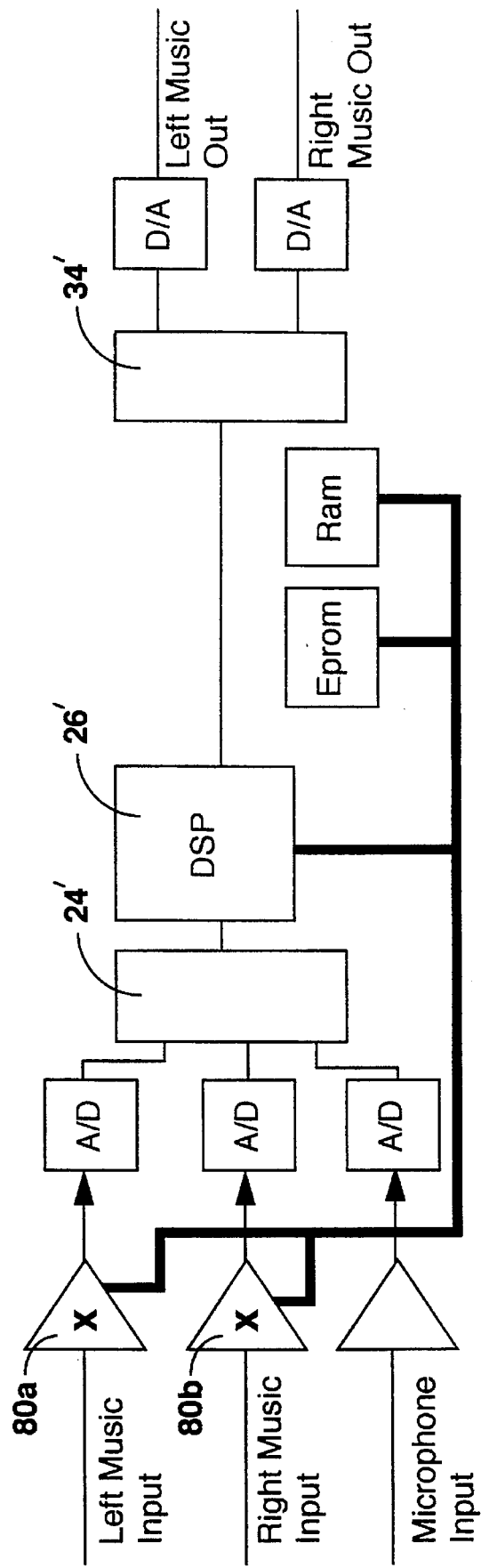
FIG. 13 is a block diagram showing the layout of the hardware incorporated in a fourth embodiment of the DSO system according to the present invention, and incorporating a digitally controlled amplifier at the input.

The systems shown in FIGS. 11 and 12 have a high signal to noise ratio, but only provide control of gain. If further processing of the signal is required (such as equalization), then a high S/N ratio can be achieved using a different embodiment of this invention as shown in FIG. 13. The analog music signal is pre-scaled by DCAs 80a and 80b before quantization. The gain of DCAs 80a and 80b is controlled by DSP 26' and this gain can be proportional to the gain of the compressor, or it can be a function of the incoming signal level. If controlled by the incoming signal level, the gain would be changed three to five times per second. In either case, gain is applied when the incoming signal is small. The gain supplied by the DCAs is offset by an equivalent gain reduction in the compressor, while the music power estimate is similarly reduced by an equivalent amount of gain. A key benefit to this embodiment is that it provides a large signal prior to quantization, thus giving the same gain controlling properties as described in the first embodiment, but with less noise induced by the quantization process.

Figure 14:
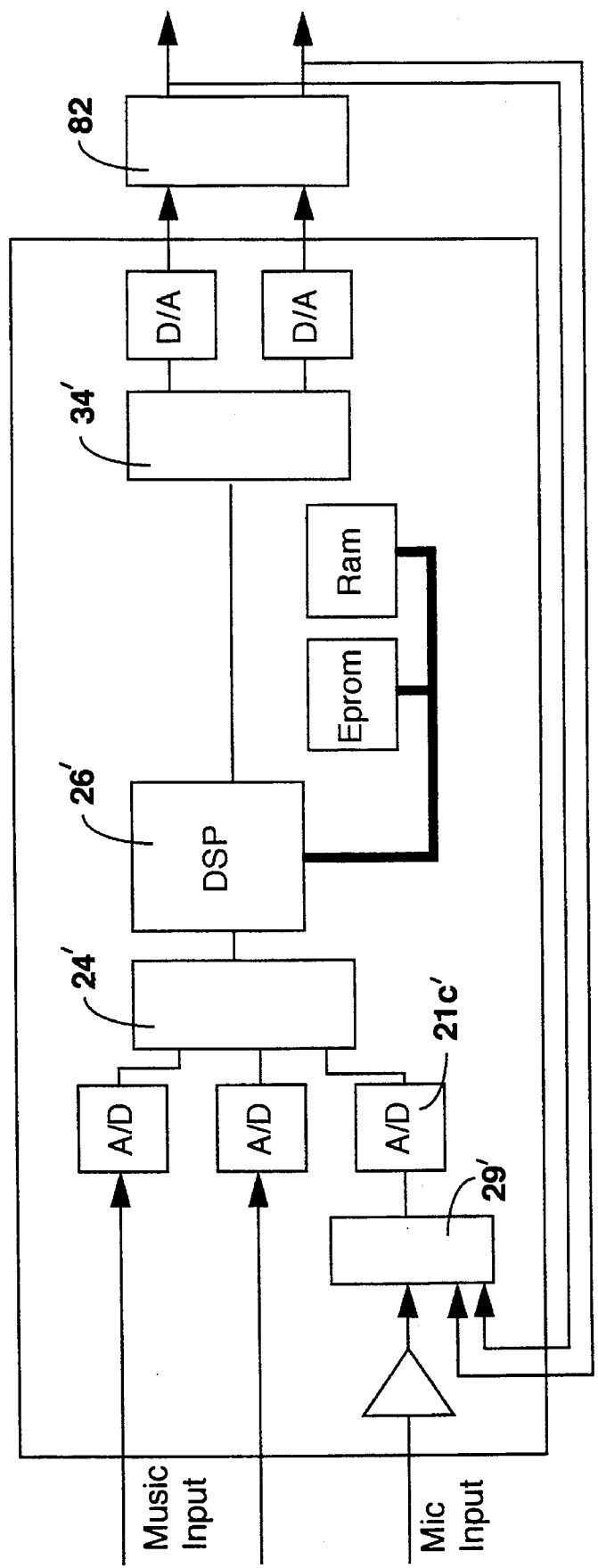
FIG. 14 is a block diagram showing the layout of the hardware incorporated in a fifth embodiment of the DSO system according to the present invention, incorporating processing before external gain control.

The embodiments discussed above and shown in FIGS. 2, 11, 12 and 13 are based on the desired listening level being set by in the audio system before the Signal is transferred to the DSO system. FIG. 14 shows yet another embodiment of this invention where the volume control 82 is placed after the DSO system by rearranging the signal paths. The unattenuated input signal to the DSO system would ensure a high S/N ratio, regardless of the volume setting of the audio system, while the system still is able to respond to the user's changes to the volume control through the connection of the output from volume control 82 to A/D converter 21c. However, additional connections need to be made to the DSO system to enable the system to analyze the changes in the volume control. In addition, this embodiment requires that the DSO system be placed in the actual audio device, such as the vehicle's radio. This may add to the cost of the overall unit.

Figure 15:
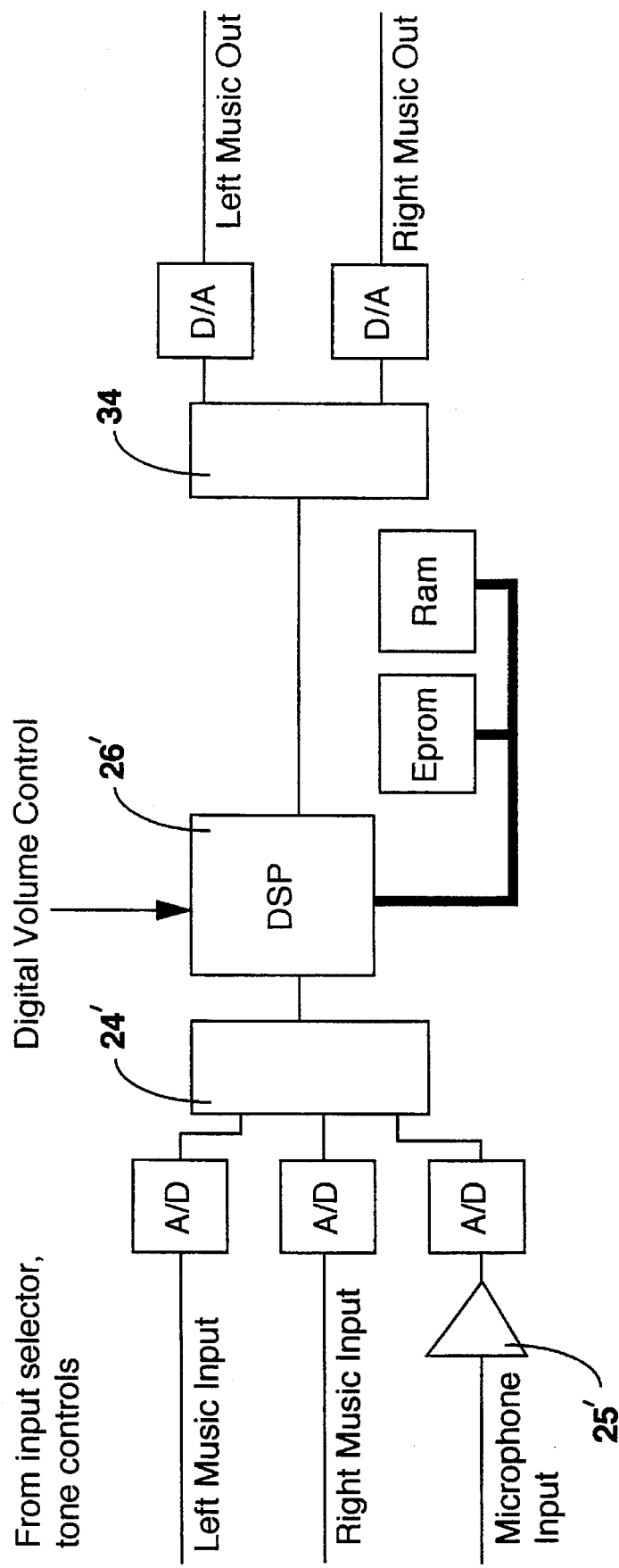
FIG. 15 is a block diagram showing the layout of the hardware incorporated in a sixth embodiment of the DSO system according to the present invention, including the use of digital volume control.

A further embodiment of this invention is shown in FIG. 15, in which the DSO system provides direct volume control. This provides high signal to noise ratio, while simplifying connections. A volume setting device (rotary knob using a shaft encoder or push buttons) would be connected directly to DSP 26'.

Figure 16:
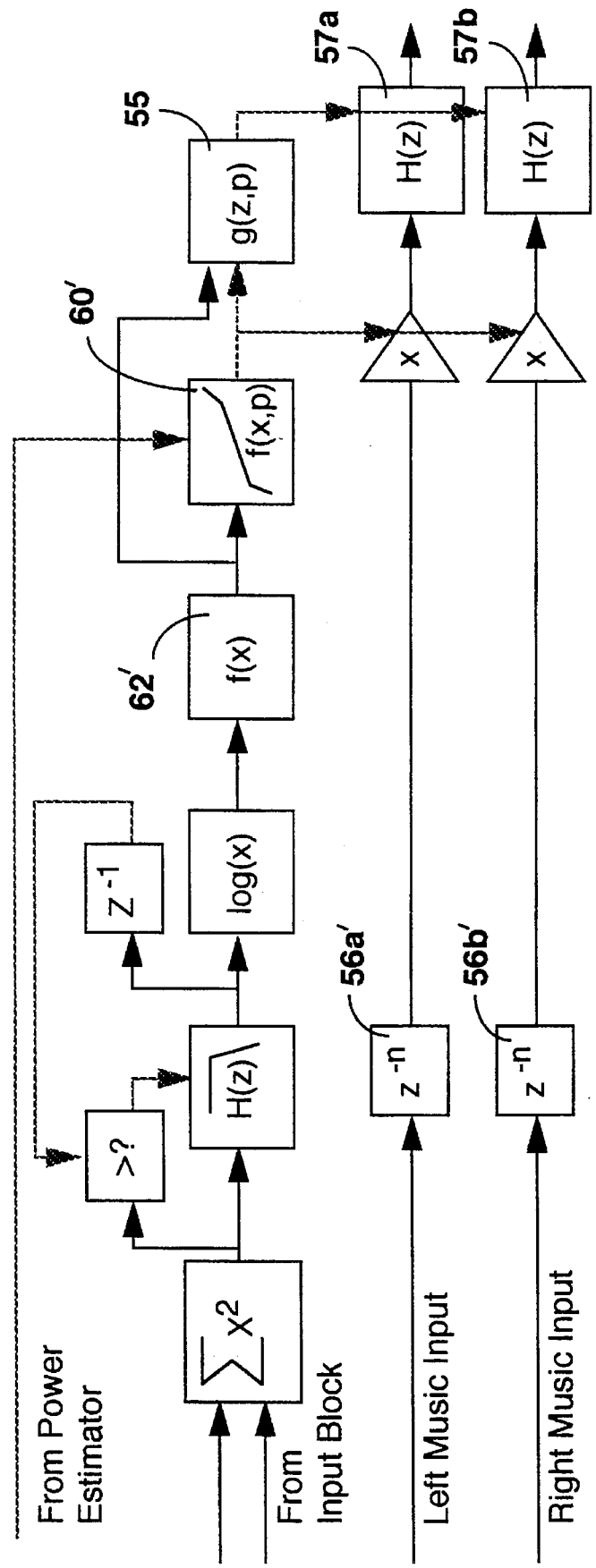
FIG. 16 is a block diagram of an alternative embodiment of the invention showing the addition of equalization.
Figure 19A:
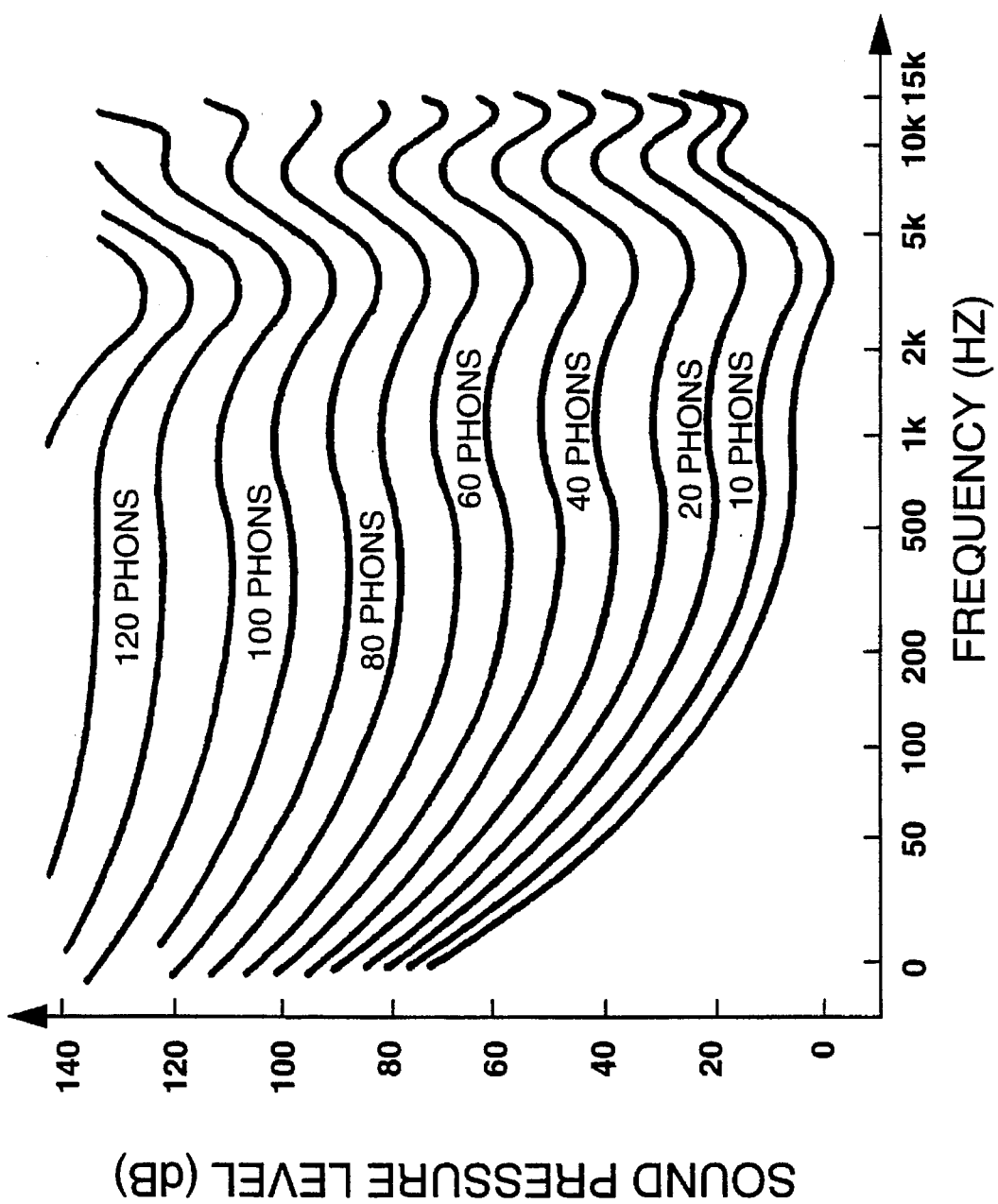
FIG. 19A and 19B are a set of equal loudness curves.
Figure 19B:
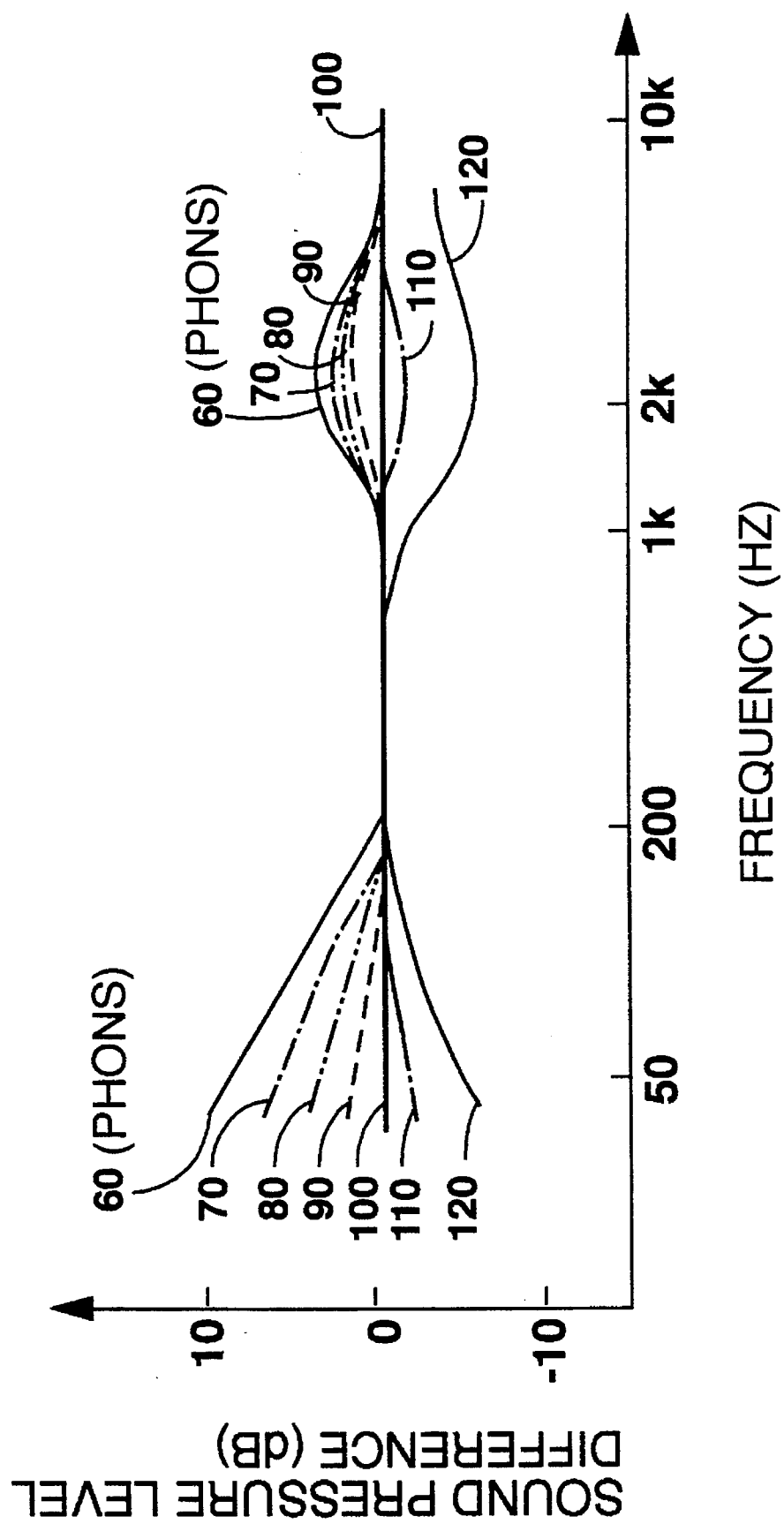

FIG. 16 shows a simple enhancement to DSO to achieve dynamic equalization. In general terms, the compressor block which had been previously described in connection with FIG. 5 is enhanced with the addition of a filter. This filter has its coefficients controlled by the gain setting. When the amount of gain to be added to the output is high, signals below 200 Hz are boosted, similar to the curves in FIG. 19B. In addition, bass boost can be applied when the music power estimate is small. This feature is accomplished through EQ calculate block 55, which receives a signal from gain calculator 60' representing the amount of gain to be provided to the output and a signal representing the music level, shown in FIG. 16 from minimum level limit 62'. These two signals are compared by EQ calculate block 55 to determine the amount of bass to add to the signal, which levels may be set depending on the designer's preferences. The adjustments are then made to the left and right output signals by tone control boxes 57a and 57b. Thus, the embodiment shown in FIG. 16 provides compensation for the varying sensitivity of human hearing at low sound levels, as shown in FIG. 19A. FIGS. 19A and 19B are based on the Robinson-Datson curves of equal sensation.

Figure 17:
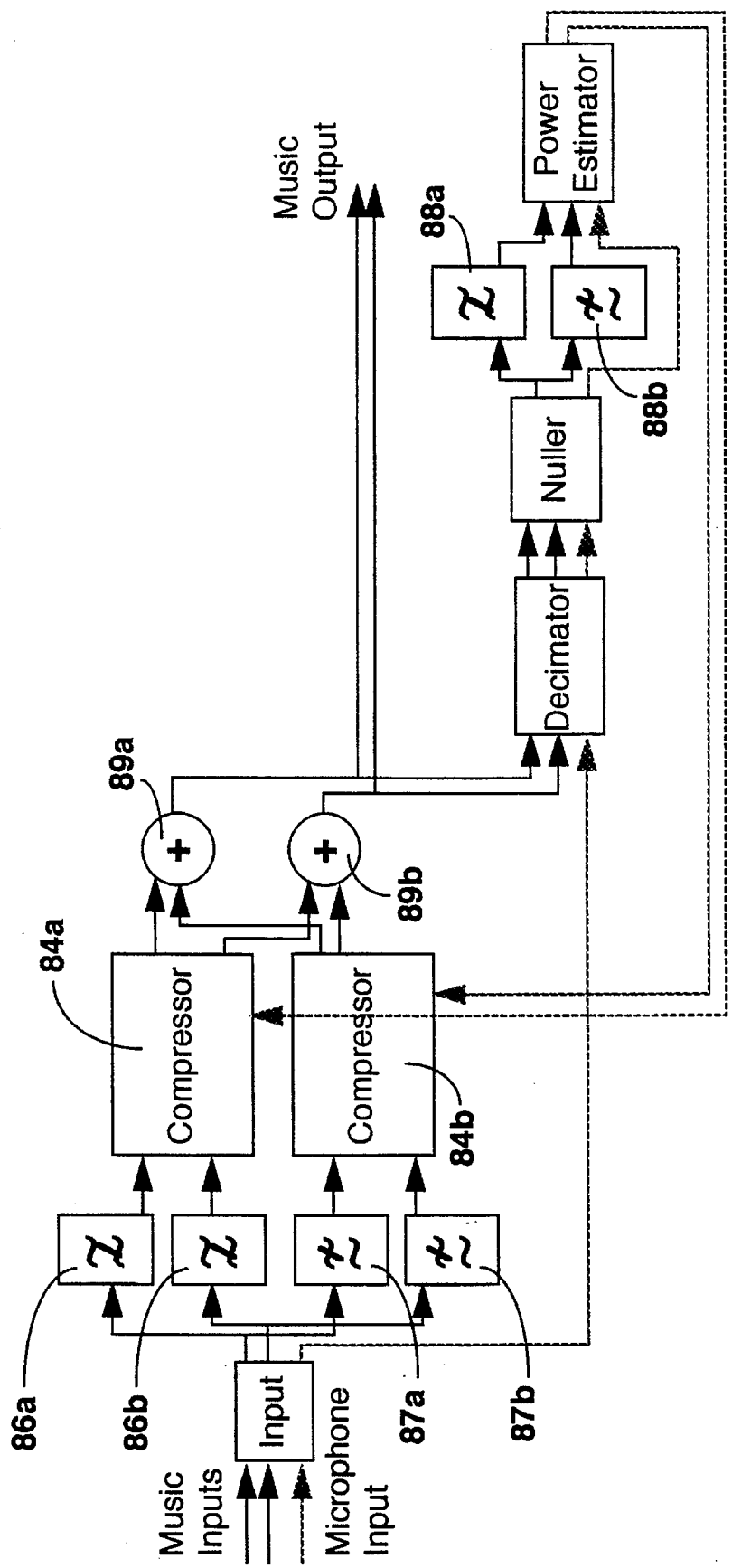
FIG. 17 is a block diagram of an alternative embodiment of the invention showing the addition of dual band processing.
Figure 18:
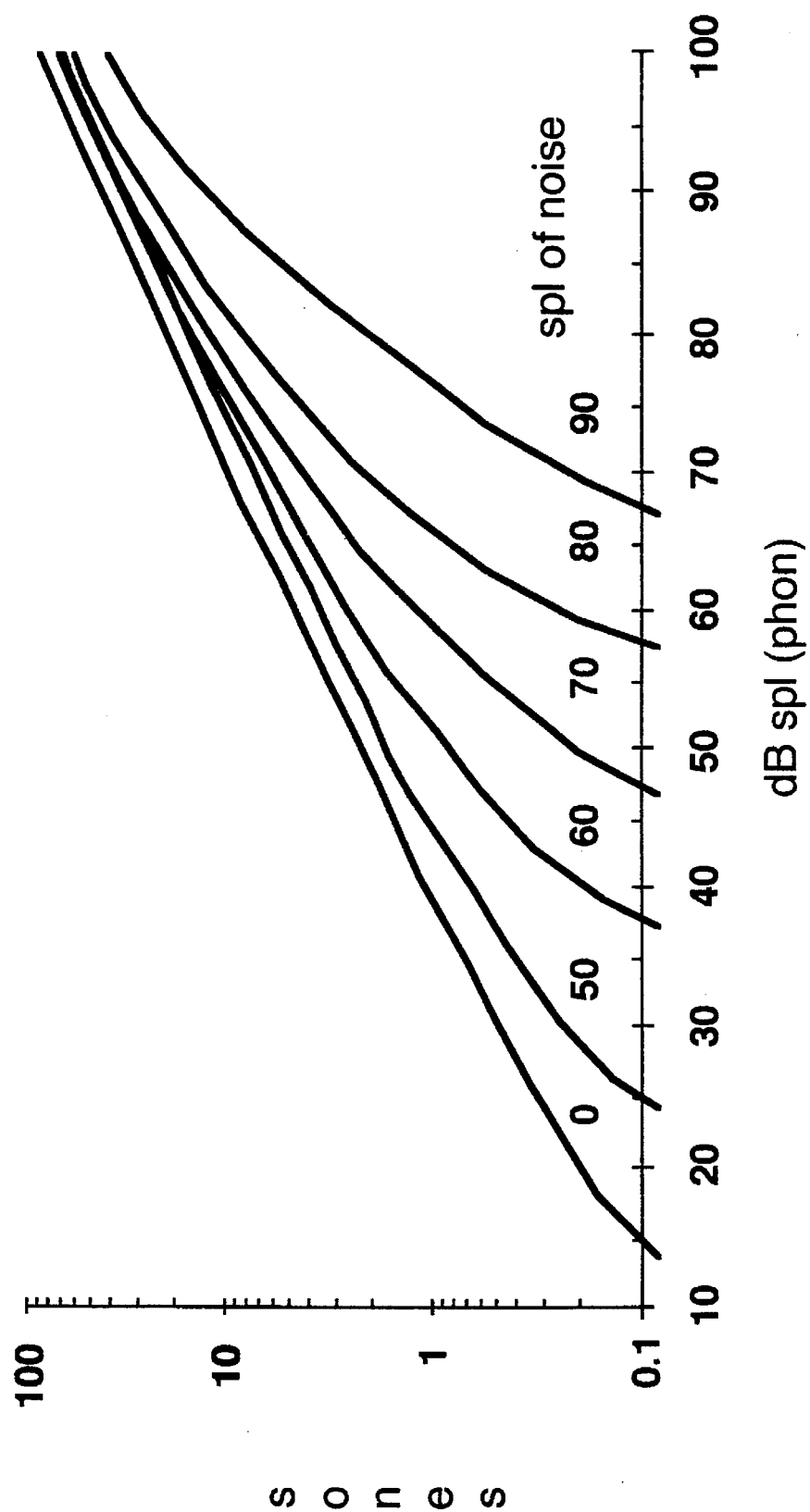
FIG. 18 shows various loudness curves and the effect of masking.

For an accurate treatment of low frequencies, the system can use separate compressors for low and high frequencies, as shown in the embodiment illustrated in FIG. 17. The noise and the music are split into separate frequency bands for analysis and compression. Specifically, FIG. 17 shows compressors 84a and 84b, one of which operates on low frequencies only and the other of which operates on the remaining frequencies of the sound signal. The signal is split using filters 86a and 86b, which are shown as blocking low frequencies and filters 87a and 87b, which are shown as blocking higher frequencies. This embodiment also shows the use of filters 88a and 88b to split the signal entering the power estimator. The high and low frequency music signals are combined again at blocks 89a and 89b before being output. The remaining elements of the embodiment shown in FIG. 17 may be the same as those previously described. While the embodiment shown in FIG. 17 uses two bands, it is understood that multiple bands could be used depending on the needs of the system.

It is further understood that the foregoing description should not be read as limiting the invention, but that this invention should be read as limited by the claims only.

We claim:

1. An audio enhancement system for compensating for ambient noise in a listening environment, comprising:

A. an audio signal source for producing an electrical sound signal;

B. a loudspeaker for generating a sound output from said electrical sound signal;

C. a microphone adapted for placement in a listening environment to provide a total sound signal representative of the total sound level in said environment, wherein said total sound level comprises both the sound output from said loudspeaker and the ambient noise within said environment;

D. a signal processor for subtracting said sound output from said total sound signal, thereby extracting an ambient noise signal representative of said ambient noise;

E. a gain calculator for comparing said electrical sound signal from said audio signal source with said ambient noise signal and determining their relative levels; and F. at least a first volume control responsive to the relative levels of the electrical sound signal and the ambient noise signal for adjusting said sound output of said loudspeaker to compensate for said ambient noise.

2. An audio enhancement system as set forth in claim 1, wherein said first volume control comprises:

A. a generator for generating a control signal based on the relative levels of the electrical sound signal and the ambient noise signal determined by said gain calculator; and a gain adjustment control responsive to said control signal for adjusting the sound output of said loudspeaker to compensate for said ambient noise level.

3. An audio enhancement system as set forth in claim 2, further comprising a second volume control for controlling the volume of said sound output, wherein said second volume control receives said electrical sound signal from said first volume control.

4. An audio enhancement system as set forth in claim 2, further comprising a second volume control for controlling the volume of said sound output, wherein said first volume control receives said electrical sound signal before it is transmitted through said second volume control.

5. An audio enhancement system as set forth in claim 1, wherein said electrical sound signal has low frequency and higher frequency components, further comprising a low frequency adjustment subsystem for adjusting the low frequency element of said sound output separately from the adjustment of said sound output by said second volume control.

6. An audio enhancement system as set forth in claim 1, further comprising analog-to-digital converters for converting said electrical sound signal and said total sound signal from analog signals to digital signals before said electrical sound signal and said total sound signal are fed to said gain calculator.

7. An audio enhancement system as set forth in claim 6, wherein said first volume control includes a digital to analog converter for converting said electrical sound signal from digital to analog prior to transmission to said loudspeaker.

8. An audio enhancement system as set forth in claim 1, wherein said gain calculator further comprises apparatus for simulating human hearing.

9. An audio enhancement system as set forth in claim 1, wherein said signal processor subtracts said sound output from said total sound signal using adaptive filters.

10. An audio enhancement system as set forth in claim 9, further comprising a decimator for limiting the computational load on said signal processor.

11. An audio enhancement system as set forth in claim 1, wherein said audio signal source comprises a left channel and a right channel and said signal processor comprises at least two adaptive filters, wherein one said adaptive filter removes information from that portion of said total sound signal that corresponds to said left channel and another said adaptive filter removes information from that portion of said total sound signal that corresponds to said right channel.

12. An audio enhancement system as set forth in claim 1, further comprising higher-frequency-pass filters for filtering the portions of said electrical sound signal and said ambient noise signal fed to said gain calculator to reduce the influence of the bass elements of said electrical sound signal and said ambient noise signal on said gain calculator.

13. An audio enhancement system as set forth in claim 1, further comprising a compressor between said audio signal source and said loudspeaker.

14. An audio enhancement system for compensating for ambient noise in a listening environment, comprising A. an audio signal source for producing an electrical sound signal;

B. a splitter for separating said electrical sound signal into a first component and a second component, said first component being substantially identical in all respects to said second component;

C. a loudspeaker for generating a sound output from said second component of said electrical sound signal;

D. a microphone adapted for placement in a listening environment to provide a total sound signal representative of the total sound level in said environment, wherein said total sound level comprises both said sound output from said loudspeaker and the ambient noise within said environment;

E. an analog-to-digital converter for converting said first component of said electrical sound signal and said total sound signal from analog signals to digital signals;

F. a signal processor for subtracting said sound output from said total sound signal, thereby extracting an ambient noise signal representative of said ambient noise;

G. a gain calculator for comparing said first component of said electrical sound signal with said ambient noise signal; and H. at least a first volume control responsive to the relative levels of the first component of said electrical sound signal and the ambient noise signal for adjusting said sound output of said loudspeaker to compensate for said ambient noise level.

15. An audio enhancement system as set forth in claim 14, wherein said gain calculator further comprises apparatus for simulating human hearing.

16. An audio enhancement system as set forth in claim 14, wherein said signal processor subtracts said sound output from said total sound signal using adaptive filters.

17. An audio enhancement system as set forth in claim 14, wherein said audio signal source comprises a left channel and a right channel and said signal processor comprises at least two adaptive filters, wherein one said first adaptive filter removes information from that portion of said total sound signal that corresponds to said left channel and another said adaptive filter removes information that portion of said total sound signal that corresponds to said right channel.

18. An audio enhancement system as set forth in claim 16, further comprising a decimator for limiting the computational load on said signal processor.

19. An audio enhancement system as set forth in claim 14, further comprising a higher-frequency pass filter for filtering the portions of said electrical sound signal and said ambient noise signal fed to said gain calculator to reduce the influence of the bass elements of said electrical sound signal and said ambient noise signal on said gain calculator.

20. An audio enhancement system as set forth in claim 14, further comprising a compressor between said audio signal source and said loudspeaker.

21. An audio enhancement system for compensating for ambient noise in a listening environment, comprising A. an audio signal source for producing an electrical sound signal;

B. a loudspeaker for generating a sound output from said electrical sound signal;

C. a microphone adapted for placement in a listening environment to provide a total sound signal representative of the total sound level in said environment, wherein said total sound level comprises both the sound output from said loudspeaker and the ambient noise within said environment;

D. a splitter for splitting said electrical sound signal from said audio signal source into at least a first and a second electrical sound signal, said first and second electrical sound signals having different frequencies;

E. a signal processor for extracting an ambient noise signal representative of the ambient noise level in said environment from said total sound signal;

F. a gain calculator for comparing said first electrical sound signal with said ambient noise signal and for comparing said second electrical sound signal with said ambient noise signal; and G. at least one volume control responsive to said gain calculator for adjusting the output of said audio signal source to compensate for said ambient noise level.

22. An audio enhancement system as set forth in claim 21, wherein said gain calculator further comprises apparatus for simulating human hearing.

23. An audio enhancement system as set forth in claim 21, wherein said signal processor subtracts said sound output from said total sound signal using adaptive filters.

24. An audio enhancement system as set forth in claim 23, further comprising a decimator for limiting the computational load on said signal processor.

25. An audio enhancement system as set forth in claim 21, further comprising a high-frequency pass filter for filtering the portions of said electrical sound signal and said ambient noise signal input to said gain calculator to reduce the influence of the bass elements of said electrical sound signal and said ambient noise signal on said gain calculator.

26. An audio enhancement system as set forth in claim 21, further comprising a compressor between said audio signal source and said loudspeaker.

27. An audio enhancement system as set forth in claim 21, further comprising analog-to-digital converters for converting said electrical sound signals and said total sound signal from analog signals to digital signals before said electrical sound signals and said total sound signal are fed to said gain calculator.

28. An audio enhancement system as set forth in claim 27, wherein said first volume control includes a digital to analog converter for converting said electrical sound signal from digital to analog prior to transmission to said loudspeaker.

29. An audio enhancement system as set forth in claim 21, wherein said audio signal source comprises a left channel and a right channel and said signal processor comprises at least two adaptive filters, wherein one said adaptive filter removes information from that portion of said total sound signal that corresponds to said left channel and another said adaptive filter removes information from that portion of said total sound signal that corresponds to said right channel.

* * * * *